United States Patent [19]

Kaloyeros et al.

[11] Patent Number: 5,376,409
[45] Date of Patent: Dec. 27, 1994

[54] PROCESS AND APPARATUS FOR THE USE OF SOLID PRECURSOR SOURCES IN LIQUID FORM FOR VAPOR DEPOSITION OF MATERIALS

[75] Inventors: Alain E. Kaloyeros, Voorheesville; Eric T. Eisenbraun, Delmar; Bo Zheng, Albany, all of N.Y.

[73] Assignee: The Research Foundation of State University of New York, Albany, N.Y.

[21] Appl. No.: 995,671

[22] Filed: Dec. 21, 1992

[51] Int. Cl.$^5$ ............................................. C23C 16/06
[52] U.S. Cl. ............................. 427/248.1; 427/226; 427/229; 427/250; 427/252; 427/255.1; 427/255.2; 427/255.7; 427/422; 427/561
[58] Field of Search .............. 427/226, 229, 561, 250, 427/252, 255.1, 255.2, 255.7, 422, 248.1

[56] References Cited

U.S. PATENT DOCUMENTS

| | | | |
|---|---|---|---|
| 4,707,383 | 11/1987 | Mattes et al. | 427/226 |
| 4,880,670 | 11/1989 | Erbil | 427/229 |
| 4,917,717 | 4/1990 | Thomas et al. | 427/226 |
| 4,992,305 | 2/1991 | Erbil | 427/226 |
| 5,021,399 | 6/1991 | Hsu et al. | 427/226 |
| 5,110,622 | 5/1992 | Hasegawa et al. | 427/226 |
| 5,120,703 | 6/1992 | Snyder et al. | 427/561 |
| 5,165,960 | 11/1992 | Platts | 427/226 |

FOREIGN PATENT DOCUMENTS

| | | | |
|---|---|---|---|
| 470274 | 2/1992 | European Pat. Off. | 427/561 |
| 54-020967 | 2/1979 | Japan | 427/229 |

OTHER PUBLICATIONS

Grant & Hackh, "Chemical Dictionary", fifth edition p. 365 [no month] (1987).

Primary Examiner—Anthony Green
Attorney, Agent, or Firm—Irving M. Freedman

[57] ABSTRACT

A process and apparatus for the use of liquid-source bubbler/delivery systems for the delivery of solid source precursors employed in the growth of advanced technical materials such as the deposition of copper films in microelectronic devices.

24 Claims, 3 Drawing Sheets

FIG_1

PROCESS AND APPARATUS FOR THE USE OF SOLID PRECURSOR SOURCES IN LIQUID FORM FOR VAPOR DEPOSITION OF MATERIALS

This invention relates to a method and apparatus for solid precursors for use in depositing films such as in chemical vapor deposition in advanced technologies such as microelectronic device fabrication.

BACKGROUND OF THE INVENTION

Advanced semiconductor submicron technologies require multilevel metallization (MLM) schemes which reduce interconnection lengths to provide lower RC time delays and enhanced performance. MLM schemes also permit increased device densification, due to the ability to use the third (vertical) dimension, and easier signal routing because of higher flexibility in architectural design. However, these schemes necessitate new interconnect metals to handle the higher current densities resulting from decreasing the dimensions of device features without loss of electrical and structural integrities, and to deliver the sheet resistance required to meet performance demands. They also require new deposition techniques to satisfactorily grow these newer interconnect metals and metal films and to successfully produce the increasingly complex architectures as lateral feature sizes are scaled down more rapidly than conductor or insulator thicknesses.

One of the most suitable metal deposition processes, in terms of providing the reliability and reproducibility in forming the multilevel structures of metals and dielectrics required, is chemical vapor deposition (CVD). CVD involves transporting volatile metal-organic precursors, which contain the elemental constituents of the target material, into a reactor. The deposition on a substrate in the reactor occurs through: (a) reactions in the gas phase leading to species which condense on the substrate to form the desired film and film pattern and/or (b) reactions of adsorbed species on the substrate surface which catalyzes or aids the decomposition into the desired film and gaseous byproducts which are continuously pumped out. One of the key advantages of CVD is its potential ability to involve the substrate surface in the deposition reaction which would lead, under the proper conditions, to a conformal, planarized blanket, or selective (patterned) metal growth. This feature is an important requirement to produce three-dimensional multilevel structures which contain interconnections in the vertical direction through vias and holes in the dielectric or substrate.

Another important characteristic of CVD is that it can produce materials on substrates of complex shape and form at growth rates which are much higher than the minimum acceptable in the electronic device industry. In addition, it can grow materials at reduced temperatures, as low as 100° C., with no need for post-deposition annealing. This is necessary to minimize the effects of interdiffusion and to allow the growth of abrupt multilayered structures. It is relatively simple and controllable, and leads to good adherence, high uniformity over a large area, and reduced susceptibility to interfacial mixing and cross-contamination effects. These unique features have made CVD the technique of choice for semiconductor applications, as documented by the extensive research and development (R&D) efforts presently underway to produce manufacturable blanket and selective CVD processes for the growth of metals, metallic alloys, and dielectrics for incorporation in MLM schemes.

These R&D efforts have already produced substantial progress in tungsten (W) CVD metallization and have led to the incorporation of W CVD, which employs the gaseous precursor tungsten hexafluoride ($WF_6$), in selected manufacturing processes used, for example, in fabrication of the 64 Mb chip. Aluminum and copper CVD metallizations have also witnessed some degree of success, with triisobutylaluminum (TIBA) and trimethylamine-alane (TMAA1), and copper (I) and copper (II) chemistries being successfully employed to grow highly pure and dense aluminum and copper films. In spite of these advances, however, the incorporation of many CVD processes in technologically useful processes has been limited by the lack of a suitable solid precursor delivery technique which exhibits the required levels of reproducibility and control typically associated with liquid and gas precursor delivery systems.

As a result, the delivery of solid precursors in CVD processing is carried out using the sublimator/bubbler method in which the precursor is usually placed in a sublimator/bubbler reservoir which is then heated to the sublimation temperature of the precursor to transform it into a gaseous compound which is transported into the CVD reactor with a carrier gas such as hydrogen, argon, or nitrogen. The introduction of the carrier gas into the sublimator is controlled by a valve, while the flow of (precursor+carrier gas) into the CVD reactor is controlled with a hot-source mass flow controller (MFC), which is heated to a temperature that prevents the precursor from recondensing inside it. However, this design suffers from numerous problems which include undesirable heat-induced effects such as premature decomposition of the precursor and changes in the characteristics of the precursor (such as reduction in volatility with time), limited flow ranges because of physical constraints on pressure drops through the MFC, and lack of accurate flow control because of the unavailability of critical precursor parameters such as heat capacity and compressibility.

Efforts to alleviate these problems through the development of improved solid source delivery systems have encountered limited success and have involved complex equipment and procedures, providing a continuing need for an improved method of delivering solid precursors for use in film deposition procedures such as the chemical vapor deposition of advanced electronic, optoelectronic, photonic, and ceramic materials for various technological applications, including metals, metallic alloys, and dielectrics for semiconductor chip metallization. Such technical applications are hereinafter referred to as "advanced technology" or "advanced technologies."

OBJECTS AND SUMMARY OF THE INVENTION

Accordingly, an object of the present invention is to provide a new and improved method and apparatus for the delivery of solid precursors for chemical vapor deposition of advanced electronic, optoelectronic, photonic, and ceramic materials for various technological applications, including metals, metallic alloys, and dielectrics for semiconductor chip metallization, or for advanced technologies.

Another object of the present invention is to provide a new and improved method and apparatus for the delivery of solid precursors in liquid form by dissolving them in appropriate solvents which do not induce any adverse changes in precursor chemistry and, consequently, do not affect the precursor decomposition process to yield pure materials in advanced technologies.

Still another object of the present invention is to provide a new and improved method and apparatus for the delivery of solid precursors in liquid form by dissolving them in appropriate solvents which can enhance precursor decomposition processes to yield pure advanced technology materials.

Yet another object of the present invention is to provide a new and improved method and apparatus for the delivery of solid precursors in liquid form by dissolving them in appropriate solvents which can be easily decoupled from the precursors at much lower temperatures than those needed to decompose the precursors, enabling ease in solvent removal from the reaction zone during CVD.

A further object of the present invention is to provide a new and improved method and apparatus for the delivery of solid precursors in a liquid solution whose flow rates can be readily controlled with high accuracy and reproducibility for the CVD growth of advanced technology materials.

A still further object of the present invention is to provide a new and improved method and apparatus for the delivery of solid precursors in liquid solution to allow ease of transportation of the mixture of the precursor and solvent to a chemical vapor deposition reactor, and which can be readily vaporized at low temperatures leading to the highly uniform growth of advanced technical materials on large area substrates.

One other object of the present invention is to provide a new and improved method and apparatus for the delivery of solid precursors in liquid solution to facilitate deposit of thin films of advanced technology materials at a relatively rapid and controllable growth rate on complex topographies, including vias, holes, and steps, on the desirable substrates.

An additional object of the present invention is to provide a new and improved method and apparatus for the delivery of solid precursors in liquid solution which simplifies the CVD growth of advanced technology materials, especially in the case when a binary, ternary, or quaternary material is being produced and a separate source precursor is needed for each of the elemental constituents of that material, enabling the use of the same, or different, chemically compatible solvents for each of the precursors involved, which are then mixed in the appropriate stoichiometric ratios desired in the target material, dissolved in these solvents, and delivered using only one liquid delivery system.

Another additional object of the present invention is to provide a new and improved method and apparatus for the delivery of solid precursors in liquid solution which can be incorporated into the various material fabrication processes which require the use of solid-state or liquid-state precursors, such as chemical vapor deposition (CVD), plasma-enhanced CVD, electron-cyclotron resonance (ECR) CVD, vapor plating, chemical fog processes, and spray processes.

To attain the above and other related objectives, in carrying out the present invention in one embodiment thereof, an embodiment for producing dense copper films, copper films of good quality are produced on various substrates in microelectronic devices utilizing a liquid delivery method in which high solubility copper (II) β-diketonate precursors are dissolved in solvents such as isopropanol and ethanol. The liquid solution is then pumped into a vaporizer to provide a vapor which is flowed into the chemical vapor deposition reactor through a shower head onto the microelectronic devices, which have been heated to a temperature in the range of 160°-170° C. and in which reactor the solvent is evaporated while the copper forms films as required on the microelectronic device surfaces. A suitable reactor pressure is in the order of 1.0–1.7 torr, and a plasma power density in the order of 0.13–0.25 watts per square centimeter is provided. The chemical vapor deposition reactor may conveniently be plasma-assisted with hydrogen being introduced into the vaporizer and a reactor plasma power in the order of 0.13–0.25 watts per square centimeter being provided.

Figure 1:
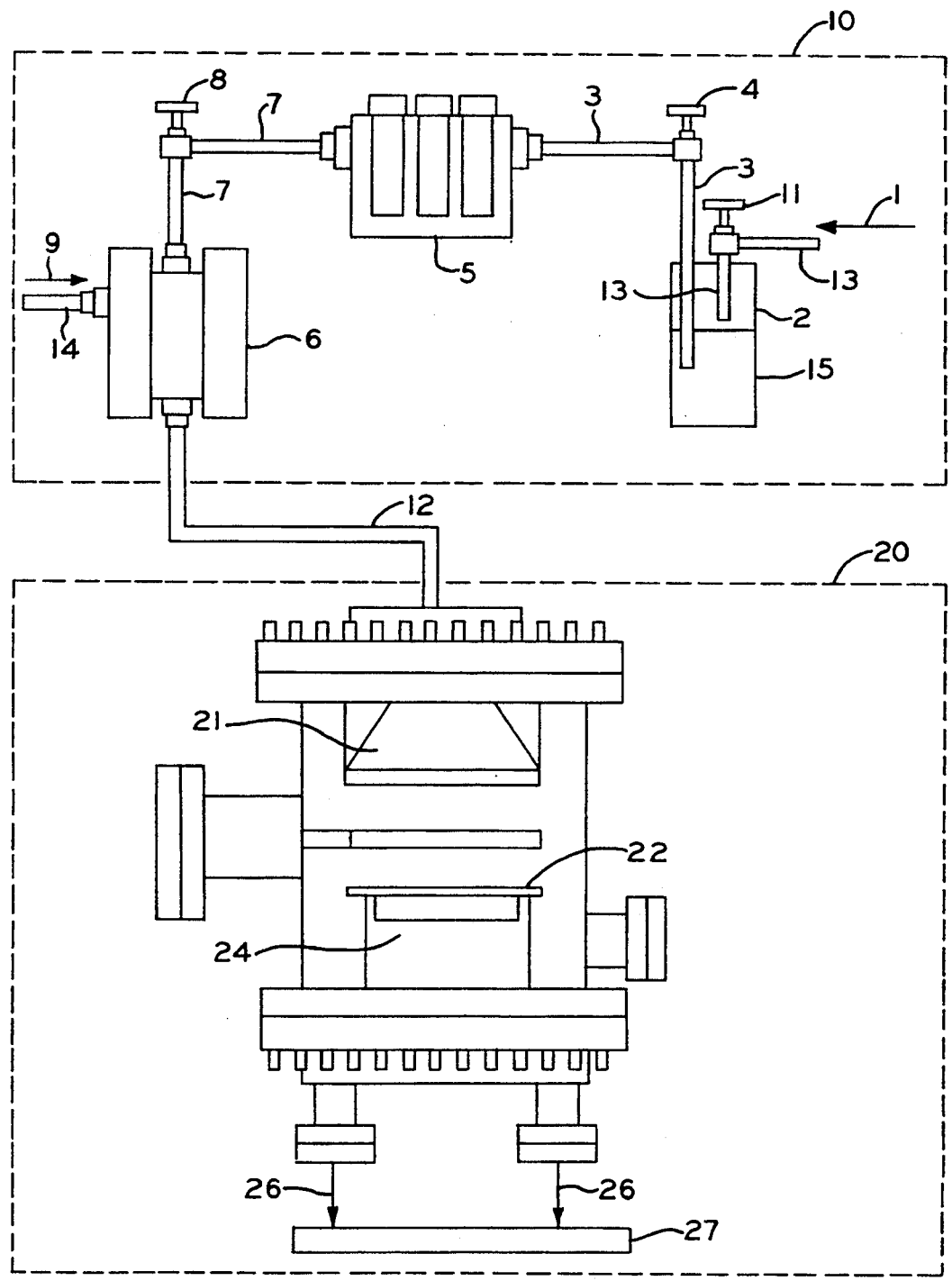
FIG. 1 is a schematic showing of equipment embodying the present invention.
Figure 2:
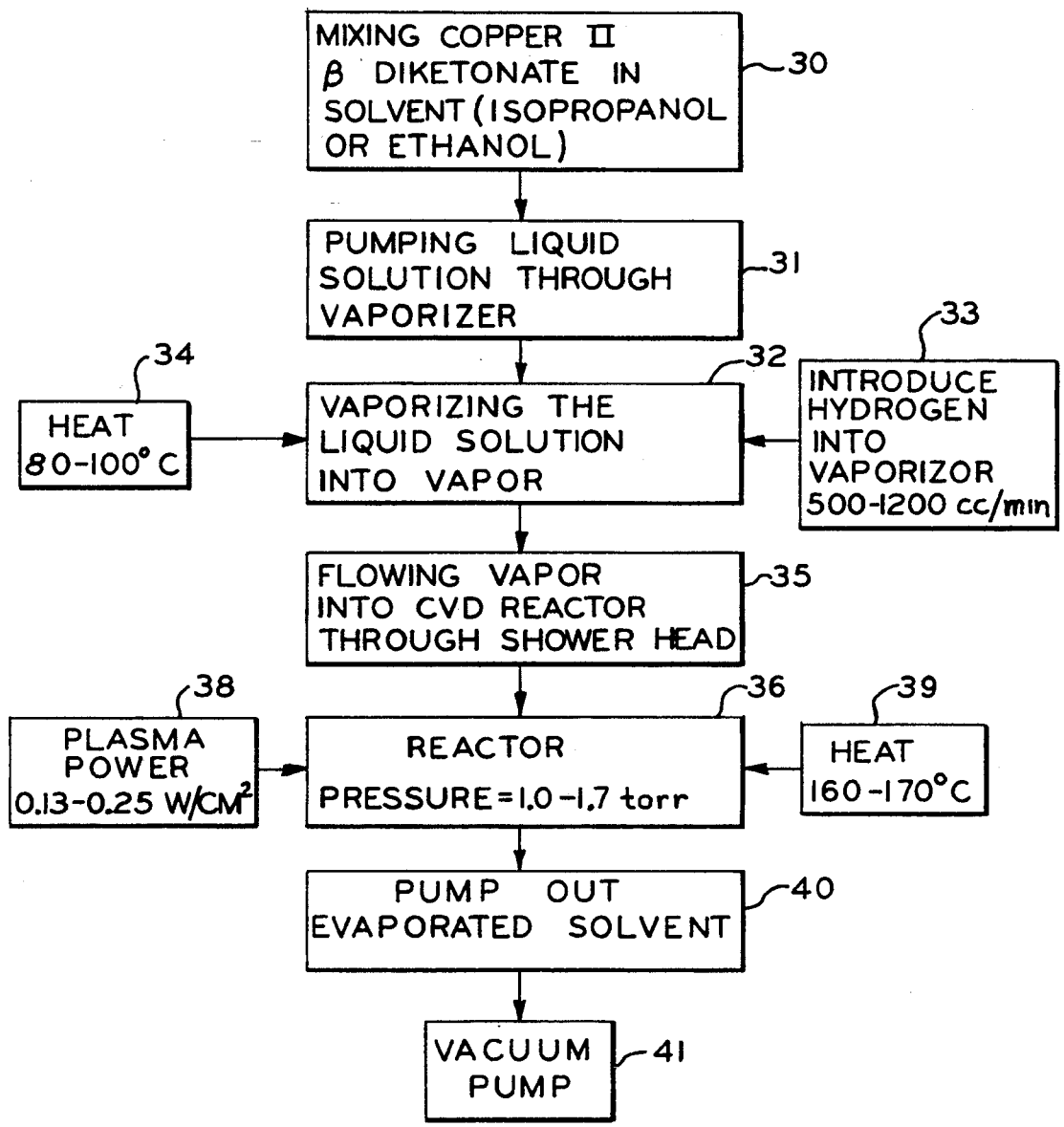
FIG. 2 is a flow chart useful in explaining the operation of FIG. I as applied to the copper CVD embodiment.

Referring first to FIGS. 1 and 2. Reservoir 2 includes a liquid containing bis (hexafluoroacetyl-acetonato) copper (II) β-diketonate precursor dissolved in a solvent which may be isopropanol, methanol, or ethanol. The reservoir 2 is kept at a temperature $T_1$=room temperature. Reservoir 2 is connected through piping 3 and control valve 4 and micropump 5 through piping 7 and control valve 8 to vaporizer 6. A controlled inert gas flow is provided into reservoir 2 by adjustment of control valve 11 which adjusts the flow of inert gas, indicated by arrow 1, passing through piping 13 into reservoir 2 to maintain a preset gas pressure. The flow rate of the liquid mixture 15 from reservoir 2 through piping 3 is adjusted by control valve 4, while the vaporizer 6 has its input adjusted by control valve 8, and controlled by a pump which controls the amount of liquid solvent which is mixed with hydrogen (shown by arrow 9) flowing through input connection 14 of the vaporizer. The vaporizer is maintained at a temperature $T_2$=100° C., ~10° C. higher than the precursor vaporization temperature. A liquid delivery system flash vaporizer such as that manufactured by MKS Instruments may be used in the system to provide accurate and reproducible liquid flows in the 0.01–2.5 ml/min range and thus provide high accuracy and improved flow control. In addition, since the precursor source is kept at room temperature under inert gas pressure, it is protected from heat-induced undesirable changes in its chemistry and characteristics. These features could help provide a promising system for the delivery of precursors in numerous CVD processes including metals (such as copper) for MLM applications, if an approach could be developed to extend the use of such systems to solid state source precursors.

The vaporized liquid mixture carries the copper (II) precursor through connection 12 from liquid delivery system 10 to reactor 20. Reactor 20 provides chemical vapor deposition on substrate 22, which is heated by heater 24 to a temperature of 160°–170° C. The working pressure of reactor 20 is maintained in the range of 1.0–1.7 torr, while hydrogen flow rate 9 provided through input connection 14 to vaporizer 6 is between 500–1200 cubic centimeters per minute, with the hydrogen plasma power density ranging from 0.13–0.25 watts per square centimeter.

Appropriate masking layers and techniques, well known in the microelectronics fabrication art, are used to obtain patterned copper films to provide the interconnections in the desired locations on the microelectronic device.

Liquid delivery system 10 provides highly accurate, reproducible and controllable flow rates of the precursor and solvent mixtures through the reaction zone within reactor 20. Moreover, it was found that the precursor is readily dissolved in the solvent, and precursor and solvent mixture 15 is easily vaporized at low temperatures to allow ease in transportation of the mixture into reactor 20. Thermal vaporizer 6 is maintained at the precursor sublimation temperature of 80°–100° C.

It was found that the precursor can be easily dissolved in the solvent without adversely changing its chemistry, and that the solvent can be readily decoupled from the precursor in the gas phase in reactor 20 without affecting its decomposition.

The vaporized mixture 15 of precursor and solvent is flowed into reactor 20 through shower head 21, which includes injector holes arranged for uniform gas dispersion and reactant mixing. Reactor 20 is a parallel-plate stainless steel reactor with radio frequency (13.56 MHz) plasma assist and in which substrate 22 is placed directly under shower head 21 on the heated bottom (ground) electrode.

By way of summary, the process of the present invention is shown in block diagram or flow chart form in FIG. 2 for the specific embodiment that involves copper CVD. Referring to FIG. 2, along with reference to FIG. 1, the mixing 30 of copper (II) $\beta$-diketonate in a solvent of isopropanol or ethanol produces a liquid solution which is pumped 31 through a vaporizer. The vaporizing 32 is conducted in a thermal vaporizer 6 with heat 34 being in the range of 80°–100° C. (which prevents precursor recondensation in the lines) and hydrogen 33 being introduced into the vaporizer at flow rates in the range of 500–1200 cubic centimeters per minute, such that the vapor 35 may be flowed into a chemical vapor deposition reactor 20 which is plasma assisted through plasma power 38 and in which the reactor pressure 36 is maintained in the range of 1.0–1.7 torr, with heat 39 maintaining the substrates upon which copper films are deposited at a temperature of 160°–170° C. The heated reactor 36 evaporates the solvent 40 which is drawn off through vacuum pump 41.

Figure 4:
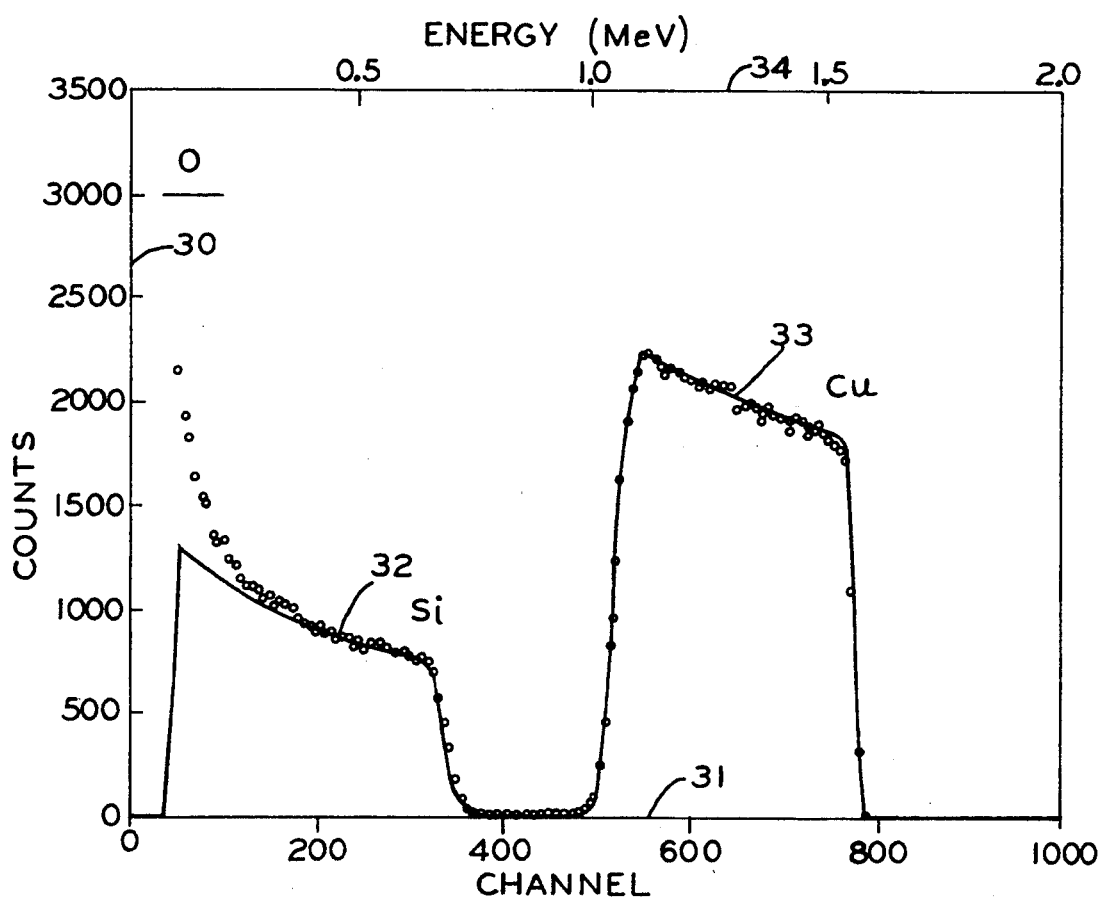
FIG. 4 is a plot illustrating the quality of copper films produced on microelectronic devices in accordance with the present invention.

Copper films produced in accordance with the present invention were of uniform thickness, continuous, reflective and mirror-bright, as established by analysis of their microstructural, microchemical and electrical properties analyzed with X-ray diffraction, high resolution x-ray spectroscopy, scanning electron microscopy (SEM), cross section SEM, four point resistivity probe testing, and also by Rutherford backscattering spectroscopy, the results of which are illustrated by FIG. 4. The copper films produced on blanket and patterned substrates 22, including holes and vias, exhibited high quality and good growth rates as high as 1000 Å per minute. X-ray diffraction analyses of copper films on a silicon wafer with a tungsten barrier layer showed a clean cooper phase with major diffraction peaks appearing at $2\theta = 43.436°$ (111), 50.566° (200), 74.242° (222) and 90.000°. Copper grain size was a function of processing parameters and type of substrate used, and varied from 0.05–0.9 micrometers. Cross section scanning electron microscopy studies indicated excellent local planarity and conformal step coverage, with complete trench and via filling. No oxygen, fluorine, or carbon peaks were detected in the copper films tested, and four-probe resistivity measurements indicated film resistivity in the range of 1.7–1.9 micro-ohms per centimeter.

Referring to FIG. 4, Rutherford backscattering (RBS) spectra were taken using a 2 MeV $He_{2+}$ beam, and calibrated with bulk samples of copper and silicon. The RBS results, shown in FIG. 4 for a 4400 Å-thick copper film on silicon, confirmed the HRXPS findings concerning film purity and the virtual absence of heavy element contaminants. The plot of the silicon counts is shown by plot 32 and that of copper by plot 33. The counts are plotted on Y axis 30, while the channel and energy are plotted on X axes 31 and 34, respectively.

Accordingly, the present invention provided copper films, on 5-inch and 8-inch silicon wafers that were pure, dense, highly uniform, and displayed desirable resistivities. Films which were produced on patterned structures exhibited conformal step coverage and complete hole and via fill.

Figure 3:
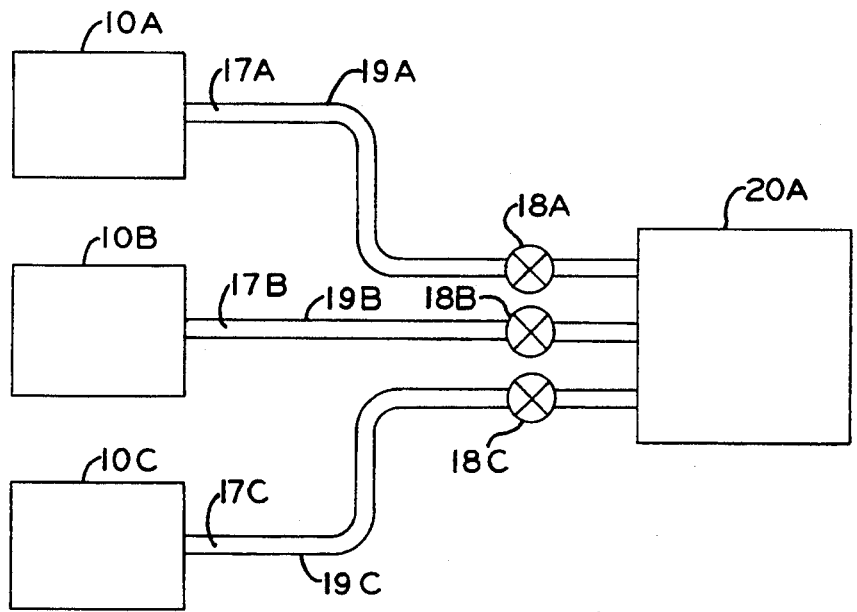
FIG. 3 is a block diagram showing an alternate embodiment of the present invention utilizing multiple solid and solvent mixtures.

The present invention may also be utilized to selectively deliver multiple solid source precursors and solvent mixtures to a single reactor as shown in FIG. 3 in order to process more complex compounds and materials such as metallic alloys and superconductors. Referring to FIG. 3, liquid delivery system 10A and 10B may be used with a single reactor 20 to provide a metallic alloy such as aluminum copper.

In the case of solid aluminum precursors, a first solvent, such as hexane, is used to dissolve the aluminum source precursor to form a first mixture in liquid delivery system 10A, and a second solvent, such as isopropanol, is used to dissolve the copper source precursor to form a second mixture in liquid delivery system 10B. The first mixture 19A is separately loaded through piping 17A and control valve 18A to reactor 20A, while the second mixture 19B is provided through piping 17B and control valve 18B to the reactor to provide aluminum copper plating, as a result of the separate delivery of aluminum and copper precursors. Additional materials could be delivered by liquid delivery system 10C through piping 17C and control valve 18C to provide three element precursors for growing more complex alloys, compounds and materials.

It is thus possible to dissolve multiple solid precursors in a single solvent liquid delivery system 10, to the extent that the solvent is suitable for and compatible with the solid source precursors. Alternatively, there may be two or more separate liquid mixtures 19A and 19B which are loaded separately into separate liquid delivery systems 10A and 10B for controlled separate transport into reactor 20. Such a process can be used to grow binary, ternary, or quaternary alloys/compounds and more complex materials such as metallic alloys and superconductors through use of multiple liquid delivery systems. It is, of course, also possible for certain different materials to utilize a common or the same solvent if the solvent is suitable for those materials. For example, in the case of copper-gold alloys, the same or a common solvent such as isopropanol or ethanol can be used for both the copper and gold. The separate liquid delivery systems 10A and 10B of FIG. 3 through their control valves 18A and 18B, respectively, enable selective control of the ratio or mix of the metals in the film produced in reactor 20A.

A further example of the use of a common solvent is in the formation of a superconductor alloy such as yttrium-barium-copper-oxide (Y—Ba—Cu—O). In this case, $\beta$-diketonate precursors Y(tmhd)$_3$, Ba(tmhd)$_2$ and Cu(tmhd)$_2$, where tmhd=2,2,6,6-tetramethyl-3,5-heptanedione, used as the elemental sources for, respectively, yttrium, barium, and copper. The three precursors are mixed in the proper stoichiometric ratios which would yield the proper composition of 1:2:3 for the Y:Ba:Cu in the film and then dissolved in a common solvent of ethanol, isopropanol, tetrahydrofluoran, diethylether, or methalane chloride. The mixture (of precursors+solvent) can then be introduced through a single liquid-source bubbler/delivery system 10 (see FIG. 1) through reservoir 2 into reactor 20. Alternatively, utilizing a dual liquid delivery system such as 10A and 10B of FIG. 3, the superconductor alloy yttrium-barium-copper-oxide (Y—Ba—Cu—O) may be grown using a common solvent ethanol for dissolving the copper and yttrium sources, while the barium source is dissolved in hexane, providing greater flexibility in control of the invention.

It is also possible to combine the liquid mixtures of precursors plus solvents to be mixed and provided into a single liquid delivery system such as reservoir 2 (see FIG. 1) of a single liquid delivery system 10 to transport and deliver all of the (source precursor+solvent) mixtures used. The yttrium-barium-copper-oxide (Y—Ba—Cu— O) superconductor system can be grown using the $\beta$-diketonate precursors Y(tmhd)$_3$, Ba(tmhd)$_2$ and Cu(tmhd)$_2$, where tmhd=2,2,6,6-tetramethyl-3,5-heptanedione, as the elemental sources for, respectively, yttrium, barium, and copper. The copper and yttrium sources are dissolved in ethanol while the barium source is dissolved in hexane. All the (precursors+solvent) mixtures are then introduced into one liquid-source bubbler/delivery system 10 and transported into reactor 20. Thus, the multiple liquid delivery systems such as 10A, 10B and 10C of FIG. 3 and the single liquid delivery system of FIG. 1 provide greatly enhanced flexibility in the formation of multi-element or multi-component films, enabling the selection of compatible solvents and solids, and their delivery in controlled ratios or proportions to reactor 20 for desired film deposition.

It is to be appreciated that while a preferred embodiment of the present invention described above involves the deposition of copper films in a microelectronic device, the process can be used for the delivery of other solid precursors in liquid form of advanced technology materials by dissolving them in appropriately selected solvents which enhance precursor decomposition and which can be readily decoupled from the precursors at much lower temperatures than those needed to decompose the precursors, enabling ease of solvent removal during CVD.

The present invention thus involves the following steps:

(1) Dissolving solid precursors in appropriate liquid solvent chemicals. The mixture is then loaded in a first zone (reservoir) of a liquid delivery system (LDS) 10 which is kept at a temperature T$_1$, where T$_1$ is much lower than the vaporization or decomposition temperature of the source precursor (typically room temperature). The mixture is then transported in a controlled and reproducible manner to a second zone of the LDS which is kept at a temperature T$_2$ higher than T$_1$. T$_2$ is selected to be higher than the vaporization temperature of the source precursor but lower than its decomposition temperature. The mixture (precursor+ solvent) is then vaporized for introduction into a fabrication reactor 20.

(2) The solvents are Selected so that: (a) the source precursor is easily dissolved in them without adverse changes in precursor chemistry, (b) the solvents possess high vapor pressure so that they are easily vaporized at low temperatures to allow ease in vaporization of (precursor+solvent) mixture into the reactor, and (c) the solvents are readily "decoupled" from the precursor in the gas phase in the reactor so as not to affect the decomposition pathways of the precursor and/or enhance the growth mechanisms of the target material.

Solvents which may be used include ethanol, methanol, isopropanol, acetone, and hexane while the appropriate source precursor may be an alkyl, hydride, chloride, halide, metal-organic, or organometallic complex. The present invention can utilize a variety of commercially available delivery apparatuses including the MKS Liquid MFC and Tylan Liquid MFC. As such, the present invention provides a new and improved method and apparatus for the delivery of solid precursors in liquid form with flow rates which can be readily controlled at high accuracy and reproducibility, and which provides ease in transportation of the mixture of the precursor and solvent to the growth reactor. Moreover, the invention can be readily retrofitted or incorporated into various material fabrication processes which require the use of solid-state or liquid-state precursors, such as chemical vapor deposition (CVD), plasma-enhanced CVD, electron-cyclotron resonance (ECR) CVD, vapor plating, chemical fog processes, and spray processes.

Thus, while the present invention has been described with respect to certain preferred embodiments thereof, it is to be understood that numerous variations in the details of construction, the arrangement and combination of parts, and the type of source precursors, solvents, growth processes, and target materials grown may be made without departing from the spirit and scope of the invention.

What we claim is:

1. A process for the delivery of solid source precursors in liquid solution for the controlled growth of films on a selected substrate which comprises:
   providing a liquid mixture of a solid source precursor and compatible liquid solvent;
   liquid delivery system means for transporting the liquid mixture in a controlled flow to a first zone heated to a first temperature sufficient to vaporize the mixture without precursor decomposition;
   vaporizing said liquid mixture in said first zone; and
   delivering the vaporized liquid mixture onto a heated substrate in a reactor to decompose said liquid mixture and form a film on said heated substrate;
   the temperature of said heated substrate being higher than said first temperature.

2. The process of claim 1 wherein said delivery system includes a zone which is heated to a temperature which is lower than that of the heated substrate.

3. The process of claim 2 wherein said liquid solvent is selected from the group consisting of ethanol, methanol, isopropanol, acetone, and hexane.

4. The process of claim 3 wherein the source precursor is selected from the group consisting of alkyls, hydrides, chlorides, halides, complexes and organometallic complexes.

5. The process of claim 3 wherein said solid source precursor is copper (II) β-diketonate, and said substrate is a microelectronic device.

6. The process of claim 5 wherein said solvent is selected from the group consisting of isopropanol and ethanol.

7. The process of claim 6 further including plasma assistance in said reactor.

8. The process of claim 7 wherein said plasma assistance is a hydrogen plasma.

9. The process of claim 7 wherein said substrate is heated to a temperature in the order of 160°–170° C.

10. The process of claim 9 wherein said reactor is maintained at a working pressure in the order of 1.0–1.7 torr.

11. The process of claim 10 wherein said plasma is a hydrogen plasma which is applied with a density in the order of 0.13–0.25 watts per square centimeter.

12. The process of claim 11 wherein said hydrogen plasma is formed by flowing 500–1200 cubic centimeters per minute of hydrogen into said reactor.

13. The process of claim 7 wherein said plasma is a hydrogen plasma which applied with a density in the order of 0.13–0.25 watts per square centimeter.

14. The process of claim 13 wherein said hydrogen plasma is formed by flowing 500–1200 cubic centimeters per minute of hydrogen into said reactor.

15. A process for the delivery of solid source precursors in liquid solution for the growth of films on a selected substrate which comprises:
providing a liquid mixture of solid source precursors and a compatible liquid solvent;
transporting the liquid mixture in a controlled flow to a zone heated to a first temperature sufficient to vaporize the mixture without precursor decomposition;
vaporizing said liquid mixture in a reactor; and
spraying the vaporized liquid mixture onto a heated substrate to decompose said precursors and form a film on said heated substrate;
the temperature of said heated substrate being higher than said first temperature;
said zone is heated to a temperature which is lower than that of the heated substrate;
said liquid solvent is selected from the group consisting of ethanol, methanol, isopropanol, acetone, and hexane; and
wherein the process is utilized to grow a metal film in which a single solvent is utilized to dissolve multiple source precursors to form said liquid mixture, which is then provided to said heated substrate to grow a composite metallic film.

16. The process of claim 15 wherein a single spray means is provided for spraying the vaporized liquid mixture.

17. A process for the delivery of solid source precursors in liquid solution for the growth of composite films controlled thickness on a selected substrate which comprises:
providing a liquid mixture of a solid source precursor and compatible liquid solvent;
transporting the liquid mixture in a controlled flow to a zone heated to a first temperature sufficient to vaporize the mixture without precursor decomposition;
vaporizing said liquid mixture in a reactor; and
spraying the vaporized liquid mixture onto a heated substrate to decompose said precursor and form a film on said heated substrate;
the temperature of said heated substrate being higher than said first temperature;
said zone is heated to a temperature which is lower than that of the heated substrate;
said liquid solvent is selected from the group consisting of ethanol, methanol, isopropanol, acetone, and hexane; and
wherein there is a plurality of solids dissolved in a plurality of liquid solvents to form a plurality of mixtures, and controlled flow of each of said mixtures enables selective proportioning of the composite film formed.

18. The process of claim 17 wherein each of said mixtures are connected to a single spray means for spraying a combined vaporized liquid mixture onto said heated substrate.

19. The process of claim 18 wherein at least two solid source precursors are dissolved in a single liquid solvent.

20. The process of claim 17 wherein said film is an aluminum-copper alloy and an aluminum precursor is mixed with a first solvent to form one of said plurality of mixtures, and a copper precursor is separately mixed with a second solvent to form another of said plurality of mixtures.

21. The process of claim 19 wherein said solid source precursors include copper and gold.

22. The process of claim 19 wherein said solid source precursors include precursors for metallic alloys of yttrium, barium and copper, all three of which are dissolved into a single solvent solution.

23. The process of claim 19 in which copper and yttrium precursors are dissolved in ethanol, and in addition a barium precursor is dissolved in hexane.

24. A process for the delivery of solid source precursors in liquid solution for the growth of films of controlled thickness on a selected substrate which comprises:
providing a liquid mixture of a solid source precursor and compatible liquid solvent;
transporting the liquid mixture in a controlled flow to a zone heated to a first temperature sufficient to vaporize the mixture without precursor decomposition;
vaporizing said liquid mixture in a reactor; and
spraying the vaporized liquid mixture onto a heated substrate to decompose said precursor and form a film on said heated substrate;
the temperature of said heated substrate being higher than said first temperature;
said zone is heated to a temperature which is lower than that of the heated substrate;
said liquid solvent is selected from the group consisting of ethanol, methanol, isopropanol, acetone, and hexane; and
wherein said liquid mixture includes copper.

* * * * *

REEXAMINATION CERTIFICATE (3211th)

United States Patent [19]

Kaloyeros et al.

[11] B1 5,376,409

[45] Certificate Issued Jun. 3, 1997

[54] PROCESS AND APPARATUS FOR THE USE OF SOLID PRECURSOR SOURCES IN LIQUID FORM FOR VAPOR DEPOSITION OF MATERIALS

[75] Inventors: Alain E. Kaloyeros, Voorheesville; Eric T. Eisenbraun, Delmar; Bo Zheng, Albany, all of N.Y.

[73] Assignee: Research Foundation of State University of New York, Albany, N.Y.

Reexamination Requests:
No. 90/003,877, Jun. 19, 1995
No. 90/004,099, Jan. 16, 1996

Reexamination Certificate for:
Patent No.: 5,376,409
Issued: Dec. 27, 1994
Appl. No.: 995,671
Filed: Dec. 21, 1992

[51] Int. Cl.⁶ .......... C23C 16/06; C23C 16/08; C23C 16/18
[52] U.S. Cl. .......... 427/248.1; 427/62; 427/226; 427/229; 427/250; 427/252; 427/253; 427/255.1; 427/255.2; 427/255.3; 427/255.7; 427/422; 427/561; 505/473; 505/477; 505/734
[58] Field of Search .......... 505/473, 477, 505/734; 427/253, 255.3, 62

[56] References Cited

U.S. PATENT DOCUMENTS

| | | | |
|---|---|---|---|
| 2,954,330 | 9/1960 | Schmieding et al. | 202/158 |
| 3,356,527 | 12/1967 | Moshier et al. | 427/253 |
| 3,549,412 | 12/1970 | Frey, Jr. et al. | 427/217 |
| 3,700,693 | 10/1972 | Cairncross et al. | 549/206 |
| 3,894,164 | 7/1975 | Dismukes et al. | 427/70 |
| 3,978,272 | 8/1976 | Donley | 428/434 |
| 4,080,926 | 3/1978 | Platakis et al. | 118/667 |
| 4,148,940 | 4/1979 | Breininger et al. | 427/226 |
| 4,501,602 | 2/1985 | Miller et al. | 65/390 |
| 4,732,110 | 3/1988 | Parsons | 118/719 |
| 4,735,852 | 4/1988 | Osada | 428/336 |
| 4,804,649 | 2/1989 | Sherif | 505/441 |
| 4,808,651 | 2/1989 | Blickle et al. | 524/366 |
| 4,837,609 | 6/1989 | Gurvitch et al. | 257/43 |
| 4,842,893 | 6/1989 | Yializis et al. | 427/497 |
| 4,845,308 | 7/1989 | Womack, Jr. et al. | 174/15.4 |
| 4,847,469 | 7/1989 | Hofmann et al. | 392/397 |
| 4,869,598 | 9/1989 | McDonald | 374/176 |
| 4,870,052 | 9/1989 | Engler et al. | 505/120 |
| 4,880,770 | 11/1989 | Mir et al. | 505/325 |
| 4,882,312 | 11/1989 | Mogro-Campero et al. | 505/473 |
| 4,908,346 | 3/1990 | Strom et al. | 505/191 |
| 4,908,348 | 3/1990 | Hung et al. | 505/220 |
| 4,915,988 | 4/1990 | Erbil | 427/252 |
| 4,916,115 | 4/1990 | Mantese et al. | 505/413 |
| 4,918,051 | 4/1990 | Mantese et al. | 505/446 |

(List continued on next page.)

FOREIGN PATENT DOCUMENTS

| | | |
|---|---|---|
| 0 297 348 | 1/1989 | European Pat. Off. . |
| 0 323 345 A2 | 7/1989 | European Pat. Off. . |
| 0 328 333 A2 | 8/1989 | European Pat. Off. . |
| 0 331 483 A2 | 9/1989 | European Pat. Off. . |
| 0 342 009 A2 | 11/1989 | European Pat. Off. . |
| 0 405 634 A2 | 1/1991 | European Pat. Off. . |
| 1305813 | 12/1989 | Japan . |
| WO89/05696 | 6/1989 | WIPO . |
| WO89/07666 | 8/1989 | WIPO . |

OTHER PUBLICATIONS

Baum et al., "Laser–Induced Chemical Vapor Deposition of Aluminum," *Appl. Phys. Lett.*, vol. 55 No. 12, 18 Sep. 1989, pp. 1264–1266.

Feurer et al., "Preparation of Gold Films by Plasma–CVD," *Appl. Phys.* A44, 171–175 (1987) No Month.

(List continued on next page.)

*Primary Examiner*—Anthony J. Green

[57] ABSTRACT

A process and apparatus for the use of liquid-source bubbler/delivery systems for the delivery of solid source precursors employed in the growth of advanced technical materials such as the deposition of copper films in microelectronic devices.

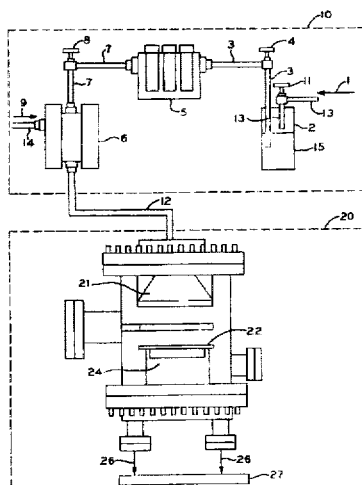

U.S. PATENT DOCUMENTS

| | | | |
|---|---|---|---|
| 4,931,425 | 6/1990 | Kimura et al. | 505/473 |
| 4,933,317 | 6/1990 | Johnson, Jr. et al. | 505/121 |
| 4,935,385 | 6/1990 | Biegelsen | 437/112 |
| 4,935,626 | 6/1990 | Schneider | 250/336.2 |
| 4,937,225 | 6/1990 | Kalonji et al. | 505/425 |
| 4,940,693 | 7/1990 | Shappirio et al. | 505/237 |
| 4,943,558 | 7/1990 | Soltis et al. | 505/475 |
| 4,943,559 | 7/1990 | Severin et al. | 505/161 |
| 4,954,371 | 9/1990 | Yializis | 427/497 |
| 5,034,372 | 7/1991 | Matsuno | 505/447 |
| 5,120,703 | 6/1992 | Snyder et al. | 505/401 |
| 5,204,314 | 4/1993 | Kirlin et al. | 505/447 |
| 5,225,561 | 7/1993 | Kirlin et al. | 546/256 |

OTHER PUBLICATIONS

Puddephatt et al., "Volatile Organogold Compounds [Au-R(CNR)]: Their Potential For Chemical Vapour Deposition of Gold," *Journal of Organometallic Chemistry*, 1987, 319, 129–137 No Month.

Llewellyn et al., "Low Temperature Pulsed Plasma Deposition: III. A Method for the Deposition of Aluminum and Tim at Room Temperature," Thin Sold Films, 1990, 191, 135–145. No Month.

Oehr et al., "Thin Copper Films by Plasma CVD Using Copper–Hexafluoro–Acetylacetonate," Appl. Phys. A 45, 151–154 (1988) No Month.

Baum et al., "Laser–Induced Chemical Vapor Deposition of High–Purity Metals," *High Temperature Science*, vol. 27, (1990) pp. 237–249 No Month.

Fujita et al., *Appl. Phys. Lett.*, (Jun. 1989) 54(23):2354–2366.

Maple, *MRS Bulletin*, (Jan. 1989):20–21.

Chien et al., *Appl. Phys. Lett.* (Dec. 1987) 51(25):2155–2157.

Spee et al., MRS Fall Meeting, Boston, MA (1988). No Month.

Kirlin et al., *Nuclear Instruments and Methods in Physics Research* A289 (1990):261–264. No Month.

Kirlin et al., *Proc. SPIE* (1989) 1187:115–127. No Month.

Mizuno et al., *Appl. Phys. Lett.* (Jan. 1989) 54(4):383–385.

Wu et al., *Appl. Phys. Lett.* (Feb. 1989) 54(8):754–756.

Hamaguchi et al., *Jpn. J. Appl. Phys.* (1990) 29(4):L596–599. No Month.

Panson et al., *Appl. Phys. Lett.*, (Oct. 1988) 53(18):1756–1758.

Radpour et al., *Appl. Phys. Lett.* (Jun. 1989) 54(24):2479–2480.

Zhao et al., *Appl. Phys. Lett.* (Oct. 1988) 53(18):1750–1752.

Blocher, Jr., *Deposition Technologies For Films and Coatings* (1982):335–339. No Month.

Cava, *Scientific American* (Aug. 1990):42–49.

Bertrand et al., *Inorganic Chemistry* 5(3) (Mar. 1966):489–491.

Belcher et al., *Anal. Chim. Acta* (1972) 60:109–116.

Kwasnick et al., *J. Mater. Res.* (Mar. 1989) 4(2):257–266.

Sauer et al., *J. Mater. Res.* (Sep. 1988) 3(5):813–818.

McCormick et al., *Polyhedran* (1988) 7(9):725–730. No Month.

Erbil et al., *Proc. SPIE* (1989) 1187:104–109. No Month.

Berkeley et al., *Appl. Phys. Lett.* (Nov. 1988) 53(20):1973–1975.

Singh et al., *Appl. Phys. Lett.* (May 1989) 54(22):2271–2273.

Satoh et al., *Appl. Phys. Lett.* (Aug. 1989) 55(7):702–704.

Sleight et al., *MRS Bulletin* (Jan. 1989):45–58.

Chan et al., *Appl. Phys. Lett.* (Oct. 1988) 53(15):1443–1445.

Lee et al., *Journal of Crystal Growth* (1986) 77:120–127. No Month.

Houtman et al., *Journal of the Electrochemical Society* (May 1986):961–970.

Zheng et al., "Device–quality copper using chemical vapor deposition of beta–diketonate source precursors in liquid solution", Applied Phys. Lett. 60(18), 2 Nov. 1992.

Eisenbraun et al., "Enhanced growth of device–quality copper by hydrogen plasma–assisted chemical vapor deposition", Appl. Phys. Lett. 60(25), 22 Jun. 1992.

Chen et al., "Effects of plasma on the CVD growth of YBCO films using a single source liquid delivery system", Abstract S7.22, 27 Apr. 1992.

Inorganic Chemistry, vol. 5, No. 3, Mar. 1966 pp. 489–491 Bertrand and Kaplan "Bis(hexafluoroacetylacetonato) copper II".

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–2, 4, 7–15, 17–18 and 24 are determined to be patentable as amended.

Claims 3, 5–6, 16 and 19–23, dependent on an amended claim, are determined to be patentable.

New claims 25–28 are added and determined to be patentable.

1. A *two-step, two-zone, two-temperature liquid delivery* process for the delivery of solid source precursors in liquid solution for the controlled growth of films on a selected substrate which comprises:

providing a liquid mixture of a solid source precursor which does not decompose at its vaporization temperature and *a* compatible liquid solvent *which does not affect the chemical structure and decomposition process of the precursor*;

[liquid delivery system means for] transporting [the] *said* liquid mixture in a controlled flow to a [first] *vaporization* zone heated to a [first] temperature sufficient to vaporize the mixture without precursor decomposition;

vaporizing said liquid mixture in said [first] *vaporization* zone *to obtain a vaporized liquid mixture*; and delivering the vaporized liquid mixture onto a heated substrate in a reactor *zone* to decompose said [liquid mixture] *precursor* and form a film on said heated substrate;

the temperature of said heated substrate *in said reactor zone* being higher than said [first] temperature *in said vaporization zone and sufficient to decouple said solvent from said precursor*.

2. The process of claim 1 wherein said [delivery system includes a] *vaporization* zone [which] is heated to a temperature which is *higher than the vaporization temperature of the source precursor but* lower than [that of the heated substrate] *the decomposition temperature of the precursor*.

4. The process of claim 3 wherein the source precursor is selected from the group consisting of alkyls, hydrides, [chlorides,] halides, [complexes] and organometallic complexes.

7. The process of claim 6 further including *low power density* plasma assistance *of not greater than 0.25 W/cm²* in said reactor.

8. The process of claim 7 wherein said plasma [assistance] is a hydrogen plasma.

9. The process of claim 7 wherein said substrate *in said reactor zone* is heated to a temperature [in] *on* the order of 160°–170° C.

10. The process of claim 9 wherein said reactor is maintained at a working pressure [in] *on* the order of 1.0–1.7 torr.

11. The process of claim 10 wherein said plasma is a hydrogen plasma which is applied with a density [in] *on* the order of 0.13–0.25 watts per square centimeter.

12. The process of claim 11 wherein said hydrogen plasma is formed by flowing 500–1200 cubic centimeters per minute of hydrogen into said reactor *zone*.

13. The process of claim 7 wherein said plasma is a hydrogen plasma which *is* applied with a density [in] *on* the order of 0.13–0.25 watts per square centimeter.

14. The process of claim 13 wherein said hydrogen plasma is formed by flowing 500–1200 cubic centimeters per minute of hydrogen into said reactor *zone*.

15. A *two-step, two-zone, two-temperature liquid delivery* process for the delivery of solid source precursors in liquid solution for the growth of films on a selected substrate which comprises:

providing a liquid mixture of solid source precursors *which do not decompose at their respective vaporization temperatures* and a compatible liquid solvent *which does not affect the chemical structure and decomposition process of any of the precursors*;

transporting the liquid mixture in a controlled flow to a vaporization zone heated to a [first] temperature sufficient to vaporize the mixture without precursor decomposition;

vaporizing said liquid mixture in a reactor *zone to obtain a vaporized liquid mixture*; and spraying the vaporized liquid mixture onto a heated substrate *in a reactor zone* to decompose said precursors and form a film on said heated substrate;

the temperature of said heated substrate *in said reactor zone* being higher than said [first] temperature *in said vaporization zone and sufficient to decouple said solvent from said precursors*;

[said zone is heated to a temperature which is lower than that of the heated substrate;]

said liquid solvent [is] *being* selected from the group consisting of ethanol, methanol, isopropanol, acetone, and hexane; and wherein the process is utilized to grow a [metal] *thin film* in which a single solvent is utilized to dissolve multiple source precursors to form said liquid mixture, which is then provided to said heated substrate to grow a composite [metallic] *thin* film.

17. A *two-step, two-zone, two-temperature liquid delivery* process for the delivery of solid source precursors in liquid solution for the growth of composite films *of* controlled thickness on a selected substrate which comprises:

providing a liquid mixture of a solid source precursor *which does not decompose at its vaporization temperature* and *a* compatible liquid solvent *which does not affect the chemical structure and decomposition process of the precursor*;

transporting the liquid mixture in a controlled flow to a vaporization zone heated to a [first] temperature sufficient to vaporize the mixture without precursor decomposition;

vaporizing said liquid mixture in [a reactor] *said vaporization zone to obtain a vaporized liquid mixture*; and spraying the vaporized liquid mixture onto a heated substrate *in a reactor zone* to decompose said precursor and form a film on said heated substrate;

the temperature of said heated substrate *in said reactor zone* being higher than said [first] temperature *in said vaporization zone and sufficient to decouple said solvent from said precursors*;

[said zone is heated to a temperature which is lower than that of the heated substrate;]

said liquid solvent [is] *being* selected from the group consisting of ethanol, methanol, isopropanol, acetone, and hexane; and wherein there is a plurality of solids dissolved in a plurality of liquid solvents to form a plurality of mixtures, and controlled flow of each of said mixtures enables selective proportioning of the *constituents of the* composite film formed.

18. The process of claim 17 wherein each of said mixtures [are] *is* connected to a single spray means for spraying a combined vaporized liquid mixture onto said heated substrate.

24. A *two-step, two-zone, two-temperature liquid delivery* process for the delivery of solid source precursors in liquid solution for the growth of films of controlled thickness on a selected substrate which comprises:

providing a liquid mixture of a solid source precursor *which does not decompose at its vaporization temperature* and *a* compatible liquid solvent *which does not affect the chemical structure and decomposition process of the precursor*;

transporting the liquid mixture in a controlled flow to a *vaporization* zone heated to a [first] temperature sufficient to vaporize the mixture without precursor decomposition;

vaporizing said liquid mixture in [a reactor] *said vaporization zone to obtain a vaporized liquid mixture*; and spraying the vaporized liquid mixture onto a heated substrate *in a reactor zone* to decompose said precursor and form a film on said heated substrate;

the temperature of said heated substrate *in said reactor zone* being higher than said [first] temperature *in said vaporization zone and sufficient to decouple said solvent from said precursor*;

[said zone is heated to a temperature which is lower than that of the heated substrate;]

said liquid solvent [is] *being* selected from the group consisting of ethanol, methanol, isopropanol, acetone, and hexane; and wherein said liquid mixture includes copper.

25. *The process of claim 24 wherein said solvent is decoupled from said precursor in said reactor zone.*

26. *The process of claim 1 wherein said solvent is decoupled from said precursor in said reactor zone.*

27. *The process of claim 15 wherein said solvent is decoupled from said precursors in said reactor zone.*

28. *The process of claim 17 wherein said solvent is decoupled from said precursor in said reactor zone.*

* * * * *